United States Patent [19]

Rice, Jr. et al.

[11] 4,370,288

[45] Jan. 25, 1983

[54] PROCESS FOR FORMING SELF-SUPPORTING SEMICONDUCTOR FILM

[75] Inventors: M. John Rice, Jr., Tempe; Ronald N. Legge, Scottsdale, both of Ariz.

[73] Assignee: Motorola, Inc., Schaumburg, Ill.

[21] Appl. No.: 207,845

[22] Filed: Nov. 18, 1980

[51] Int. Cl.³ .............................................. B29C 13/00
[52] U.S. Cl. ....................................... 264/81; 264/60; 264/61; 264/62; 357/7; 427/69; 427/86
[58] Field of Search ...................... 264/60, 61, 62, 81, 264/85; 357/7; 427/69, 85, 86

[56] References Cited

U.S. PATENT DOCUMENTS

| | | | |
|---|---|---|---|
| 3,560,364 | 2/1971 | Burkhardt | 204/192 |
| 3,900,540 | 8/1975 | Robba et al. | 264/81 |
| 4,131,659 | 12/1978 | Authier et al. | 264/81 |
| 4,159,354 | 6/1979 | Milnes et al. | 427/74 |
| 4,160,797 | 7/1979 | Goppinger et al. | 264/81 |
| 4,238,436 | 12/1980 | Hill et al. | 264/81 |
| 4,250,148 | 2/1981 | Cota et al. | 264/81 |

FOREIGN PATENT DOCUMENTS 2825047 12/1979 Fed. Rep. of Germany ........ 264/81

OTHER PUBLICATIONS

"Self-Supporting Silicon Films for Terrestrial Applications by Energy Beam Plasma," Sarma et al. Proc. 13th IEEE Photo-Voltaic Specialists Conference, p. 466, 6/78.

"The Thermal Expansion Shear Separation (TESS) Technique for Producing Thin Self-Supporting Silicon Films for Low Cast Solar Cells," Sarma et al. IEEE Transactions on Electron Devices, vol. Ed.-27, No. 4, p. 651, 4/80.

Primary Examiner—Thomas P. Pavelko
Assistant Examiner—W. Thompson
Attorney, Agent, or Firm—John A. Fisher

[57] ABSTRACT

A process is provided for forming a self-supporting semiconductor film or ribbon. A TESS substrate is prepared from a substrate of refractory material having an expansion coefficient different from the expansion coefficient of the semiconductor material. A colloidal suspension of graphite is applied to the substrate to form a thin layer of loosely adherent graphite particles. Over this layer of graphite is deposited a layer of the semiconductor material, the deposition occurring at an elevated temperature. Upon cooling from the deposition temperature, the differential thermal expansion coefficience causes the shearing at the graphite layer and therefore provides for the easy removal of the semiconductor layer from the substrate.

10 Claims, 3 Drawing Figures

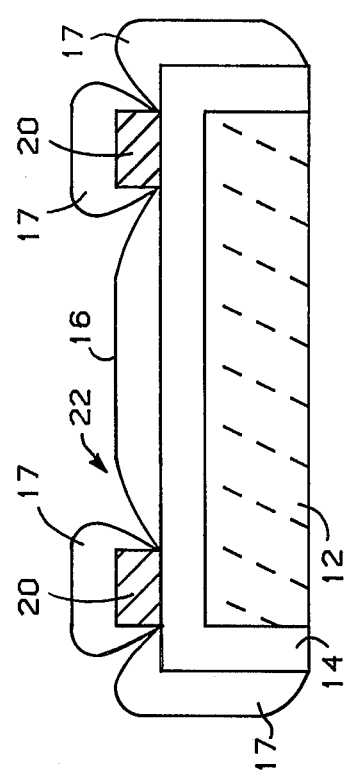
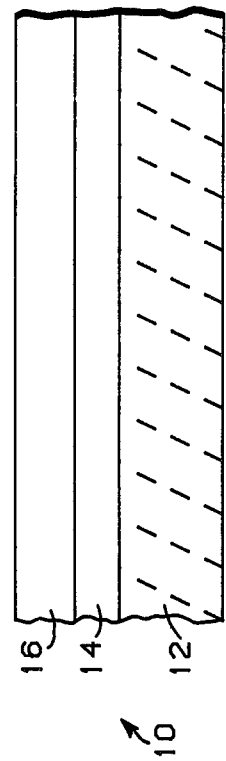
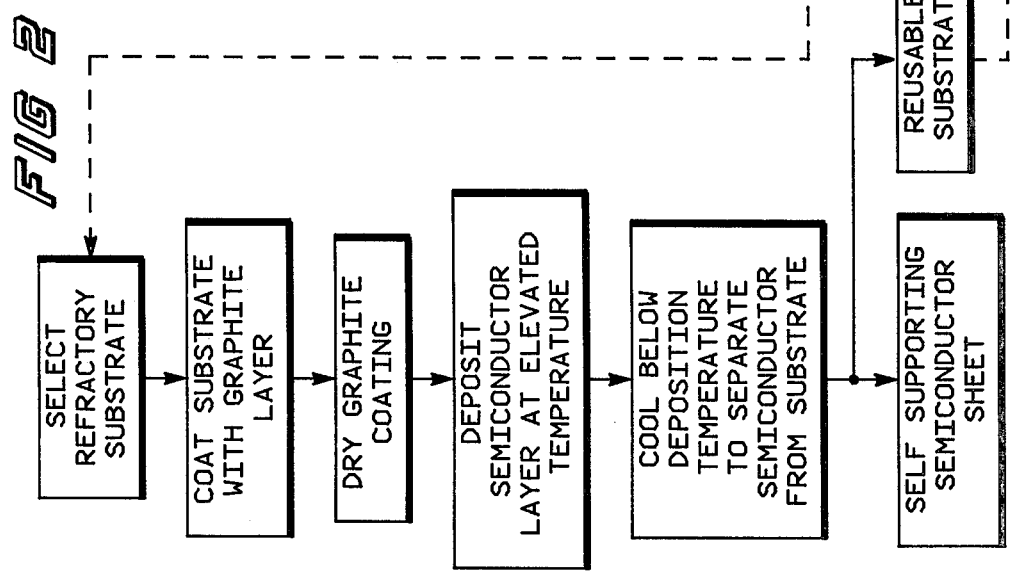

PROCESS FOR FORMING SELF-SUPPORTING SEMICONDUCTOR FILM

BACKGROUND OF THE INVENTION

This invention relates, in general, to an improved process for the formation of self-supporting semiconductor layers, and, more specifically, to an improvement in the process which allows the shear separation of a semiconductor layer from a deposition substrate.

There is a need in the semiconductor industry and especially in that portion of the semiconductor industry concerned with the fabrication of photovoltaic devices for high quality, low cost semiconductor substrates. While the conventional technique of pulling a single crystal ingot, sawing it into wafers, and lapping and polishing the wafers to the desired thickness and surface finish is acceptable in the fabrication of many devices and integrated circuits, it is too costly for the large scale production of large area photovoltaic devices.

There has therefore been an effort to develop alternate sources of semiconductor material and especially for the production of thin sheets of silicon material in large area sheets or ribbons. One such technique is the ribbon-to-ribbon (RTR) process by which a polycrystalline ribbon or sheet is locally melted, for example through localized laser heating, to convert the polycrystalline material to a substantially monocrystalline or large grain polycrystalline ribbon or sheet. Producing the material in such thin sheets eliminates the need for any costly sawing, lapping, and polishing steps to achieve the necessary thin sheet semiconductor substrate.

To be successful, however, the RTR process requires a source of polycrystalline semiconductor material in sheet or ribbon form. There are, in turn, a number of techniques which have been proposed to produce such thin sheets of polycrystalline semiconductor material. One such technique, for example, is the chemical vapor deposition of polycrystalline silicon on a thermal expansion shear separation (TESS) substrate. Polycrystalline silicon is deposited at an elevated temperature and, upon cooling, the differential thermal expansion between silicon and the deposition substrate causes separation of a thin self-supporting polycrystalline sheet from the underlying substrate.

To be successful and practical, the substrates must be inexpensive or reuseable. The substrate must be refractory, contribute little unwanted dopant at the deposition temperature, and must have an expansion coefficient different from that of the semiconductor material being deposited. A further important requirement is that the semiconductor material not adhere to the substrate. Certain materials, for example sheet graphite and silicon dioxide, have expansion coefficients considerably different from silicon, but deposited silicon adheres to these substrate materials. The materials are therefore not usable as conventional TESS substrates. Upon cooling from the deposition temperature, the differential expansion coefficient causes shattering of the deposited silicon layer, not the separation in a unitary thin sheet.

Molybdenum is one material which meets most of the above enumerated criteria for a TESS substrate for the deposition of silicon. Molybdenum is refractory, contributes little doping to the deposited silicon, has a different thermal expansion coefficient than silicon, and does not adhere to the deposited silicon layer. Molybdenum is, however, a fairly expensive substrate material. The expense of the substrate is compounded by the fact that molybdenum substrates have a limited lifetime. As silicon is deposited on the molybdenum, a layer of molybdenum silicide forms at the substrate surface. In fact, this silicide layer participates in the shear separation mechanism. After a number of deposition cycles the amount of silicide builds up, a considerable amount of the molybdenum is consumed, and the substrate becomes brittle and unusable for subsequent depositions. The high cost of the molybdenum substrate transfers to the silicon being formed and makes the cost of the silicon excessively high.

Accordingly, in view of the need for low cost, self-supporting polycrystalline semiconductor sheets and ribbons and in view of the deficiencies in existing processes for obtaining such sheets and ribbons, there existed a need for a new and improved technique for producing such material.

It is therefore an object of this invention to provide an improved and economical process for producinng self-supporting sheets of semiconductor material.

It is a further object of this invention to provide an improved technique for the thermal expansion shear separation of a semiconductor material from a deposition substrate.

It is a still further object of this invention to provide an economical thermal expansion shear separation substrate.

SUMMARY OF THE INVENTION

The foregoing and other objects and advantages are achieved in the present invention through the use of a graphite coating layer applied to the surface of a refractory deposition substrate. The graphite, which may be in the form of a colloidal suspension, is applied to a substrate of refractory material having an expansion coefficient different from the semiconductor material. A or material separates from the substrate because of the differential thermal expansion coefficient. The graphite layer prevents adhesion of the semiconductor to the substrate and prevents the formation of semiconductor-substrate compounds.

BRIEF DESCRIPTION OF THE DRAWINGS

FIG. 1 illustrates in cross-section a TESS substrate and semiconductor layer;

FIG. 2 is a flow diagram illustrating process steps in accordance with the invention.

FIG. 3 illustrtes a deposited layer of semiconductor material on a masked TESS substrate.

DETAILED DESCRIPTION OF PREFERRED EMBODIMENTS

FIG. 1 illustrates in cross-section a thermal expansion shear separation (TESS) substrate 10 in accordance with the invention. Composite substrate 10 includes a refractory substrate 12 which is coated on at least one surface with a layer of graphite 14. Overlying the graphite layer is a deposited layer of semiconductor material 16.

FIG. 2 illustrates a process flow in accordance with the invention by which the layer of semiconductor material is deposited on the composite substrate and subsequently separated to form a self-supporting semiconductor sheet or ribbon.

Substrate 12 is selected from a wide range of refractory materials. The substrate must have a thermal expansion coefficient which is different than that of the semiconductor layer to be formed. Representative materials for use with deposited silicon layers include, for example, molybdenum, tungsten, alumina, fused silica, solid graphite, silicon nitride, and mullite. The thickness of the substrate is not critical to the invention and is preferably, for example, in the range of about 0.5–2.0 mm. The material chosen must not constitute a significant doping source at the deposition temperature. Because of the graphite layer 14, it is not important that the substrate material be one to which the semiconductor material does not adhere. For example, solid graphite, fused silica, and alumina cannot be employed as conventional TESS substrates for the deposition of silicon but can be used in accordance with the invention. A smooth or polished surface is preferred as that yields a semiconductor sheet having a similar smooth surface.

Graphite layer 14 provides a release layer between substrate 12 and deposited semiconductor layer 16. Layer 14 comprises a loosely bonded layer of carbon granules which only weakly adhere to substrate 12. Carbon granules can be prepared, for example, in a colloidal suspension which is then applied to the substrate by painting, spraying, dipping, roller coating, or the like. Suitable sources of the carbon material, for example, are the products designated as DAG154, DAG110 and Aquadag E supplied by Acheson Industries, Inc. These materials comprise carbon particles colloidally suspended in a volatile medium with a binder added. The graphite is applied in a layer having a thickness of, for example, about 7–50 micrometers. After applying, the layer is either air-dried or baked to drive off the volatile portions.

The graphite layer performs a dual function. The layer assists in the separation of the semiconductor layer from the underlying layer. It also protects the substrate during the deposition and extends the useful life of the substrate. By using the graphite layer the refractory substrate can be used almost indefinitely. On a molybdenum substrate used for the deposition of silicon, for example, the graphite layer inhibits the formation of molybdenum silicide and the consequent consumption of molybdenum.

Polycrystalline semiconductor layer 16 is deposited over graphite layer 14 by any of the chemical vapor deposition (CVD) processes. To deposit a polycrystalline silicon layer, for example, the chemical vapor deposition is accomplished using any of the common halide or hydride silicon source gases such as $SiH_4$, $SiH_2Cl_2$, $SiHCl_3$, $SiCl_4$, or the like. The deposition must be carried out at a temperature below the melting point of silicon to avoid carbon being dissolved and going into solution with the silicon. It is also desirable to avoid a deposition temperature at which silicon carbide readily forms from the reaction of the depositing silicon and the carbon layer. Accordingly, it is preferred that the deposition temperature be maintained as low as possible; $SiHCl_3$ is therefore preferred as the source of silicon to $SiCl_4$ because, in a reaction with hydrogen, silicon is released at a lower temperature with the former than with the latter. Preferably the deposition temperature for silicon is in the range of about 910° C. to 1150° C.

FIG. 3 illustrates, in cross-section, a simple masking technique used to prevent deposition on the edges of the TESS substrate. Without some masking the deposition could take place equally on all surfaces of the substrate. The deposited layer would then "wrap around" the substrate and would fracture rather than separating easily as the temperature is lowered. As illustrated, refractory substrate 12 is coated with graphite layer 14. Thin strips of molybdenum 20 are placed along each side of the substrate as a mask. As the deposition proceeds, semiconductor material 16, 17 is deposited on the substrate and on the mask, respectively. The gas kinetics of the deposition process limit the deposition of material in the corner 22 formed by the mask and the substrate. The limited deposition in the corner allows the mask and deposited layer to separate easily while the mask prevents a continuous deposition of semiconductor material wrapping around the edge of the substrate.

After the polycrystalline semiconductor layer is deposited to a thickness of about 25–500 micrometers and preferably to a thickness of about 100–250 micrometers, the deposition reaction is terminated. The composite substrate comprising a refractory substrate coated with a layer of graphite and the deposited semiconductor layer is lowered in temperature from the elevated deposition temperature. As the temperature is reduced, the different expansion coefficients of the refractory substrate and the polycrystalline semiconductor layer cause the two to separate with the separation occurring at the graphite layer. The separation typically occurs at a temperature about 200° C. below the deposition temperature. The result is a self-supporting polycrystalline semiconductor sheet and a refractory substrate which can now be recoated with graphite and reused in a subsequent deposition operation. The graphite bonds only weakly to the semiconductor sheet and that which does adhere is easily removed, for example, by heating to a temperature of about 1000° C. and passing a mixture of water vapor and an inert gas over the surface of the sheet. The graphite reacts with the water vapor at that elevated temperature to form carbon monoxide and hydrogen, each of which are removed as gases.

The following non-limiting examples represent best modes contemplated by the inventors for practicing the invention and serve to describe the invention further.

EXAMPLE I

A thermal expansion shear separation (TESS) substrate is prepared by brushing a colloidal graphite coating onto an alumina ($Al_2O_3$) substrate. The substrate is about 0.15 cm by 7.5 cm by 32 cm and has a smooth surface. The graphite coating is DAG 154 diluted with an equal volume of isopropyl alcohol to provide a consistency suitable for brushing. Two coats of graphite are applied to form a coating having a thickness of about 10 $\mu$m. The prepared substrate is placed on a graphite susceptor and inserted into a horizontal, induction heated chemical vapor deposition reactor. The edges of the substrate are masked with strips of molybdenum to prevent a continuous deposit at the edges of the substrate. The substrate is heated to a temperature of 1100° C. and silicon is deposited by the hydrogen reduction of silicon tetrachloride. After one hour of deposition the $SiCl_4$ flow is terminated and power to the reactor is reduced to allow the substrate and deposited silicon to cool at a rate of about 30° C. per minute. After cooling to room temperature and purging the reactor with nitrogen, the substrate is removed. An integral sheet of silicon about 174 $\mu$m in thickness, 70 cm in width and 32 cm in length is lying on but separated from the substrate. The substrate is suitable for reuse after cleaning off the residual, weakly adherent graphite.

EXAMPLE II

A TESS substrate is prepared by coating a smooth, fused silica substrate with graphite. The graphite is applied by dip coating the silica substrate in DAG 110 diluted with methyl ethyl ketone. The graphite layer is about 18 μm thick. The substrate is placed in a resistance heated furnace and heated to about 1050° C. Silicon is deposited on the substrate from a trichlorosilane source by high pressure plasma aided chemical vapor deposition as disclosed more fully in copending application Ser. No. 148,095, filed May 9, 1980. The depositing silicon is doped P-type by adding $B_2H_6$ to the reactant gas sources. After forty-five minutes of deposition the reaction is terminated and the substrate and deposited silicon are allowed to cool to room temperature in an inert ambient. A sheet of silicon having a substantially uniform thickness of 200 μm is separated from the deposition substrate.

EXAMPLE III

A graphite susceptor, of the type used in a horizontal, induction heated CVD reactor, is spray coated with DAG 154 diluted with isopropyl alcohol. Four coats of graphite are applied to form a layer about 17 μm in thickness. Strips of molybdenum are placed on the susceptor to delineate a 10 cm by 30 cm rectangle. Deposition of silicon is carried out as in Example I. Upon cooling and removal from the reactor a 200 μm thick sheet of polycrystalline silicon 10 cm by 30 cm is obtained which is completely separated from the susceptor.

Thus it is apparent that there has been provided, in accordance with the invention, a novel and improved method for fabricating self-supporting semiconductor sheets that fully meets the objects and advantages set forth above. The method allows the deposition and subsequent separation of semiconductor layers from a wide variety of reusable deposition substrates. While the invention has been described in conjunction wih the chemical vapor deposition of polycrystalline silicon layers, it is not intended that the invention be so limited. The process can be used for the deposition of other semiconductor materials on a wide variety of deposition substrates by a number of different deposition techniques. Other variations and modifications will, of course, be apparent to those skilled in the art in light of the foregoing description. Accordingly, it is intended to embrace all such variations and modifications as fall within the scope of the invention.

We claim:

1. A process for forming a self-supporting sheet or ribbon of semiconductor material which comprises the steps of: providing a sheet or ribbon substrate or refractory material having an expansion coefficient different from said semiconductor material, said substrate having a surface; coating said substrate including said surface with a layer of graphite; providing a deposition mask near an edge of said surface to limit deposition of said semiconductor material to a portion of said surface interior to said deposition mask; depositing at a first temperature a layer of said semiconductor material overlying said layer of graphite; reducing the temperature to a second temperature lower than said first temperature; and removing said layer of said semiconductor material from said substrate.

2. A process for forming a self-supporting sheet or ribbon of silicon which comprises the steps of: providing a sheet or ribbon substrate of refractory material having a surface and having a thermal coefficient of expansion different from silicon; applying a coating of graphite to said substrate, said coating having a thickness of about 10–50 micrometers; providing a deposition mask to limit deposition of silicon to said surface; chemical vapor depositing a layer of silicon on said coating of graphite, said deposition occurring at a temperature of about 900° C. to 1150° C.; terminating said deposition; and lowering the temperature to room temperature to separate said layer of silicon from said substrate.

3. A process for forming a self-supporting sheet or ribbon of semiconductor material which comprises the steps of: providing a sheet or ribbon substrate of refractory material having an expansion coefficient different from said semiconductor material, said substrate having edges and a surface; coating said surface of said substrate with graphite; providing masking means to prevent deposition of said semiconductor material on said edges of said substrate; heating said substrate to a first elevated temperature and depositing a layer of said semiconductor material on said graphite; reducing the temperature of said substrate to a second temperature lower than said first temperature; and removing said layer of said semiconductor material from said substrate.

4. The process of claim 1 wherein said refractory material is selected from the group consisting of mullite, alumina, fused silica, molybdenum, tungsten, and graphite.

5. The process of claim 1 wherein said layer of graphite is applied from a colloidal suspension of graphite in a volatile medium.

6. The process of claim 1 wherein said step of depositing comprises chemical vapor deposition.

7. The process of claim 6 wherein said step of depositing comprises plasma aided chemical vapor deposition.

8. The process of claim 6 wherein said semiconductor material comprises silicon.

9. The process of claim 8 wherein said first temperature is in the range of about 900° C. to about 1150° C.

10. The process of claim 2 further comprising the step of doping said layer of silicon during said step of chemical vapor depositing.

* * * * *